United States Patent [19]

Lindner

[11] Patent Number: 5,122,394
[45] Date of Patent: Jun. 16, 1992

[54] APPARATUS FOR COATING A SUBSTRATE

[75] Inventor: Georg H. Lindner, Vlissingen, Netherlands

[73] Assignee: Atochem North America, Inc., Philadelphia, Pa.

[21] Appl. No.: 528,519

[22] Filed: May 25, 1990

Related U.S. Application Data

[63] Continuation-in-part of Ser. No. 71,501, Jul. 9, 1987, Pat. No. 4,928,627, which is a continuation-in-part of Ser. No. 812,873, Dec. 23, 1985, abandoned.

[51] Int. Cl.$^5$ .............................................. C23C 16/00
[52] U.S. Cl. ................................. 427/255.5; 427/166; 427/424; 118/718
[58] Field of Search ......................... 118/314, 326, 718; 427/255.5, 166, 424; 65/60.5, 60.51, 60.52, 60.2, 60.3

[56] References Cited

U.S. PATENT DOCUMENTS

| | | | |
|---|---|---|---|
| 3,293,074 | 12/1966 | Nickl | 118/725 |
| 3,876,410 | 4/1975 | Scholes | 427/255 X |
| 4,351,267 | 9/1982 | Kalbstopf et al. | 118/718 |
| 4,574,733 | 3/1986 | Nath et al. | 118/718 |
| 4,584,206 | 4/1986 | Sleighter | 427/166 |
| 4,612,217 | 9/1986 | Gordon | 427/166 X |

Primary Examiner—Shrive Beck
Assistant Examiner—Alain Bashore
Attorney, Agent, or Firm—Stanley A. Marcus; Robert B. Henn

[57] ABSTRACT

A coating applicator is provided for depositing a film on a surface of glass or other substrates by chemical-vapor deposition. The applicator includes a pair of opposing coating nozzles for applying a vaporized coating-chemical reactant in a carrier gas to the surface at such a concentration and velocity that coating of the surface is achieved under substantially reaction-rate-controlled conditions. Each coating nozzle is positioned adjacent the surface with a small clearance therebetween, the clearance being open to the outside atmospehre. The opposing coating nozzles are directed toward each other at a selected angle with respect to the surface of the substrate. The angle and the clearance provide a condition where there is substantially no intermixing of coating vapors with the outside atmosphere.

14 Claims, 14 Drawing Sheets

APPARATUS FOR COATING A SUBSTRATE

CROSS-REFERENCE TO RELATED APPLICATIONS

This application is a continuation-in-part of my copending U.S. patent application Ser. No. 071,501, filed Jul. 9, 1987, now U.S. Pat. No. 4,928,627, which was a continuation-in-part of then-copending U.S. Pat. Ser. No. 812,873, filed Dec. 23, 1985 and now abandoned.

BACKGROUND OF THE INVENTION

1. Field of the Invention

This invention relates to apparatus for chemical vapor deposition (CVD) of coatings onto substrates such as flat glass substrates, and, more particularly, to apparatus suitable for forming metal-containing and like films having advantageous properties in an efficient and economical manner.

2. Description of the Prior Art

The desirability of applying uniform coatings to a flat glass substrate for the purpose of varying its thermal, optical and/or electrical properties has long been recognized. Such coatings generally consist of a metal or metal oxide, particularly tin oxide. In such process, a hot, freshly formed glass ribbon travels from a flat-glass forming section to an annealing section, where the coating is deposited on at least one face thereof. The coating applicator generally consists of one or more nozzles which direct a spray of coating-chemical reactant in a carrier gas onto the exposed face of the glass ribbon. Thereafter, reaction by-products and unused coating compound are removed by exhaust means.

Conventional coating apparatus, systems and processes are disclosed, inter alia, in U.S. Pat. Nos. 4,598,023; and 4,601,917; in EPO No. 0188962; an article entitled "Production of Chemical Vapor Deposition Coatings" by Nicholas M. Gralenshi, Watkins-Johnson Co., Scotts Valley, Calif. 95066, pages 102-144; and an article entitled "Coating of Glass by Chemical Vapor Deposition" by John M. Blocher, Jr. in Thin Solid Films, No. 77, pages 51-63 (1981).

In the CVD process, it is desirable to apply to flat glass substrates coatings which are uniform, haze-free, have a low electrical resistivity, and which are formed during a relatively short deposition time.

Although each of these requirements can be met individually, it is exceedingly difficult to satisfy all of them at the same time. For example, high substrate temperatures will provide short deposition times, and coating chemicals containing a dopant precursor, applied at high substrate temperatures, result in films having lower electrical resistance. Moreover, high deposition temperatures favor increased haze in the coatings formed. Similarly, haze-free films can be achieved by using a low surface temperature and relatively low water-vapor content in the coating gases, albeit at the expense of reduced deposition rate and poorer electrical properties. Uniform coatings also require the application of a substantially uniform coating-chemical composition at uniform vapor velocities on each spot on the surface of the glass substance, a condition difficult to achieve with known nozzle applications. In short, conventional CVD systems are found to be deficient with respect to one or more of these film qualities and process parameters.

Furthermore, with prior-art systems, a larger exhaust for removing spent gases has generally been required. Such large exhausts tend to draw outside gases, e.g. air, into the coating zone, which action dilutes the concentration of coating vapors. On the other hand, a small exhaust system will allow coating gases to escape from the coating zone and become admixed with the outside atmosphere. In both cases, the diluted vapors which contact the glass substrate produce unacceptably hazy films. Moreover, large amounts of exhaust reduce the efficiency of use of coating material, and increase the cost of recovery of coating material from the exhaust gases.

Many of these prior CVD systems use nozzles positioned adjacent to the surface of the substrate, and which are provided with clearances between the nozzle and substrate and between the exhaust port and substrate. These open systems result in the introduction and mixing of outside air with coating vapors, causing haze, as shown, for example, in U.S. Pat. No. 4,123,244.

Further, with conventional CVD systems, the assumed relationships between coating-gas velocity, chemical concentration and chemical consumption, with nozzle slit width, have provided coating applicators which are less than satisfactory. Specifically, such relationships have required a nozzle applicator with a rather narrow slit width, which causes extreme problems with film uniformity and nozzle clogging. In addition, such systems consume a large amount of chemical reactant, resulting in an uneconomical process. On the other hand, systems which use a low gas velocity or low chemical concentration tend to effect deposition at a rate which is controlled primarily by the diffusion of chemicals to and from the substrate surface; this tends to produce a coating which is hazy and has a rough surface.

SUMMARY OF THE INVENTION

The present invention provides a coating-applicator system and deposition method for CVD of a metal-containing film on a surface of a substrate, particularly a flat glass substrate, such as, e.g., a moving float-glass ribbon. The coating applicator of the invention includes nozzle means for applying a vaporized coating chemical in a carrier gas to the substrate at a high jet velocity and high chemical concentration, such that deposition is carried out under substantially reaction-rate controlled conditions. The nozzle means include a pair of opposing nozzles positioned adjacent the surface of the substrate, each being directed toward the other at a selected angle to the surface, with a clearance therebetween which is open to the outside atmosphere, such that there is substantially no intermixing of coating gases with the outside atmosphere. The apparatus further includes means for supplying one or more vaporized coating chemicals and carrier gas to the nozzle means, as the same or separate chemicals in each nozzle, and means for removing exhaust material. The system preferably includes means to recirculate the gases within the system over the nozzle means to facilitate operation at the desired high gas velocities and high chemical concentrations.

With the apparatus of the present invention, reaction-rate-controlled conditions are achieved at high substrate temperatures under relatively high velocities and high coating-chemical concentrations. Under such conditions, small variations in jet velocities or chemical concentration have little or no influence on deposition rate. This process is advantageous over diffusion-rate-controlled processes, where the reaction rate is approximately proportional to the chemical concentration, and highly influenced by the gas velocity; these latter two are difficult parameters to control. In this invention, the deposition rate is affected by changes in deposition temperature; accordingly, the surface temperatures must be kept substantially the same on each spot on the surface of the substrate in order to avoid variations in film thickness across the film surface. However, because this condition is a stable one normally found in float-glass production, it is substantially without effect in the operation of the present invention.

Usually, in a CVD process on glass, the surface of the glass is kept at a substantially constant temperature between about 550 and 700 degrees centigrade (°C.). At these temperatures, it is possible herein to deposit a uniform, electrically conducting film without haze at a deposition rate of more than 1000 angstroms per second (Å/sec). Such films are made by using high jet velocities and high chemical concentrations with substantially no intermixing of coating chemical with outside air. The apparatus of the present invention permits the use of such desired high velocities and high chemical concentrations in an efficient CVD process under reaction-rate-controlled conditions.

Figure 1:
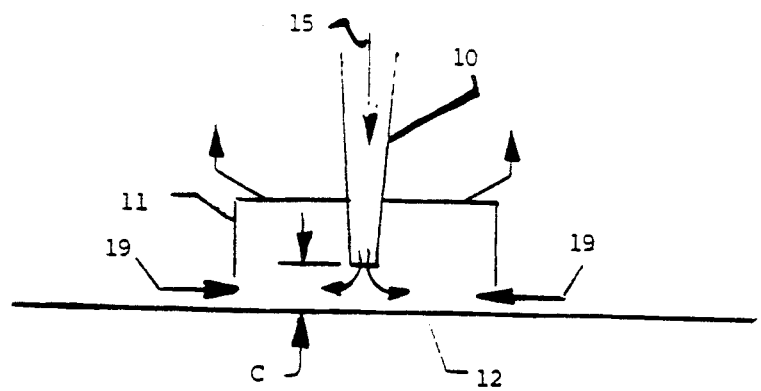
FIG. 1 is a schematic view of apparatus of the prior art having a nozzle arranged at a set clearance distance from a flat glass substrate.
Figure 2:
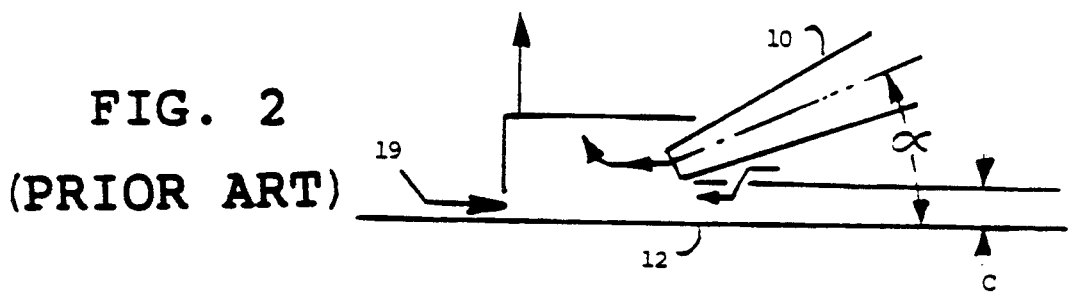
FIG. 2 is a schematic view of apparatus of the prior art having a nozzle arranged at a large angle to a flat glass substrate.

In order to understand fully the present invention, the problems associated with prior nozzle-type coating systems will be illustrated in FIGS. 1 and 2. In FIG. 1, a coating-jet nozzle 10 in coating plenum 11 is directed substantially perpendicular to a substance surface 12 with a clearance C therebetween. In this nozzle applicator, the carrier gas with vaporized coating chemical therein, noted herein as coating gas 15, will exhaust equally in opposite directions over the surface of substrate 12, allowing outside gas 19 to enter from both sides of the coating zone.

Similarly, as shown schematically in FIG. 2, a coating-jet nozzle 10 is oriented at a large angle $\alpha$ with respect to the surface of substrate 12. This arrangement allows substantially all of the coating gas 15 to escape from the coating zone in one direction. In such case, considerable outside air 19 enters the system between nozzle 10 and substrate 12 to mix with and dilute coating gas 15.

Figure 3:
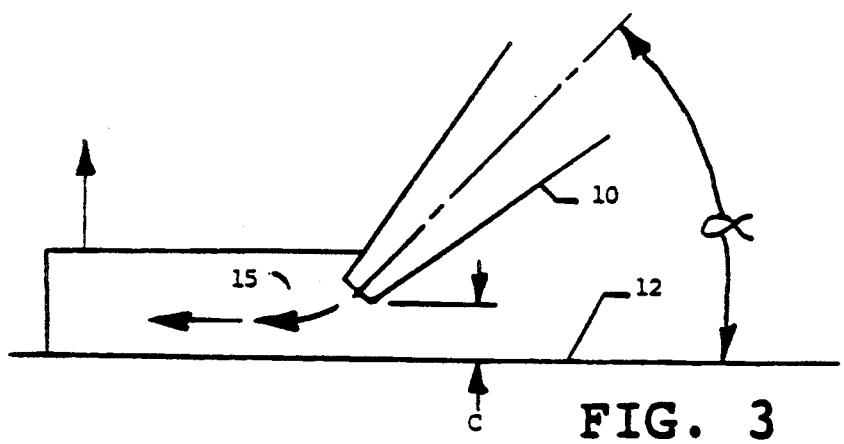
FIG. 3 is a schematic view of an embodiment of the present invention, with a nozzle arranged at a suitable angle to a flat glass substrate, there being substantially no gas intermixing.

In the present invention, as shown partially in FIG. 3, by defining a suitable nozzle angle $\alpha$ at a predetermined jet velocity of gas 15 through nozzle 10, and a selected clearance C, substantial reduction of intermixing of outside air is achieved.

However, in the nozzle arrangement of FIG. 3, where the nozzle is directed to one side of the coating zone only, and an exhaust duct draws spent gases from the same side of the coating apparatus, the amount of outside gases entering the system becomes solely dependent upon the quantity of exhausted gases, the latter quantity being very difficult to control.

Figure 4:
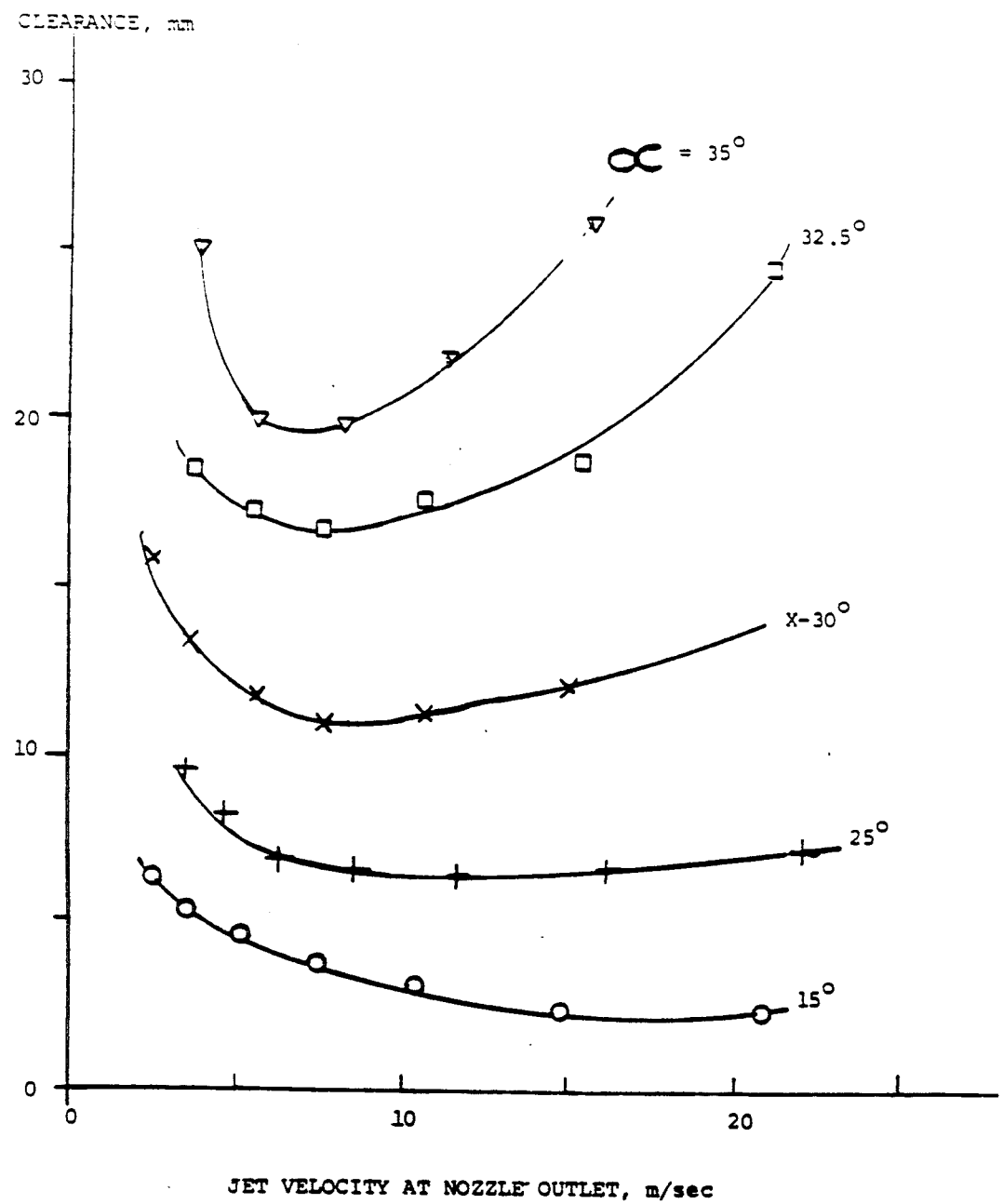
FIG. 4 illustrates operating curves for the nozzle arrangement of FIG. 3, showing the relationship of clearance distance and jet velocities at various angles for the condition of substantially zero air intermixing.
Figure 5:
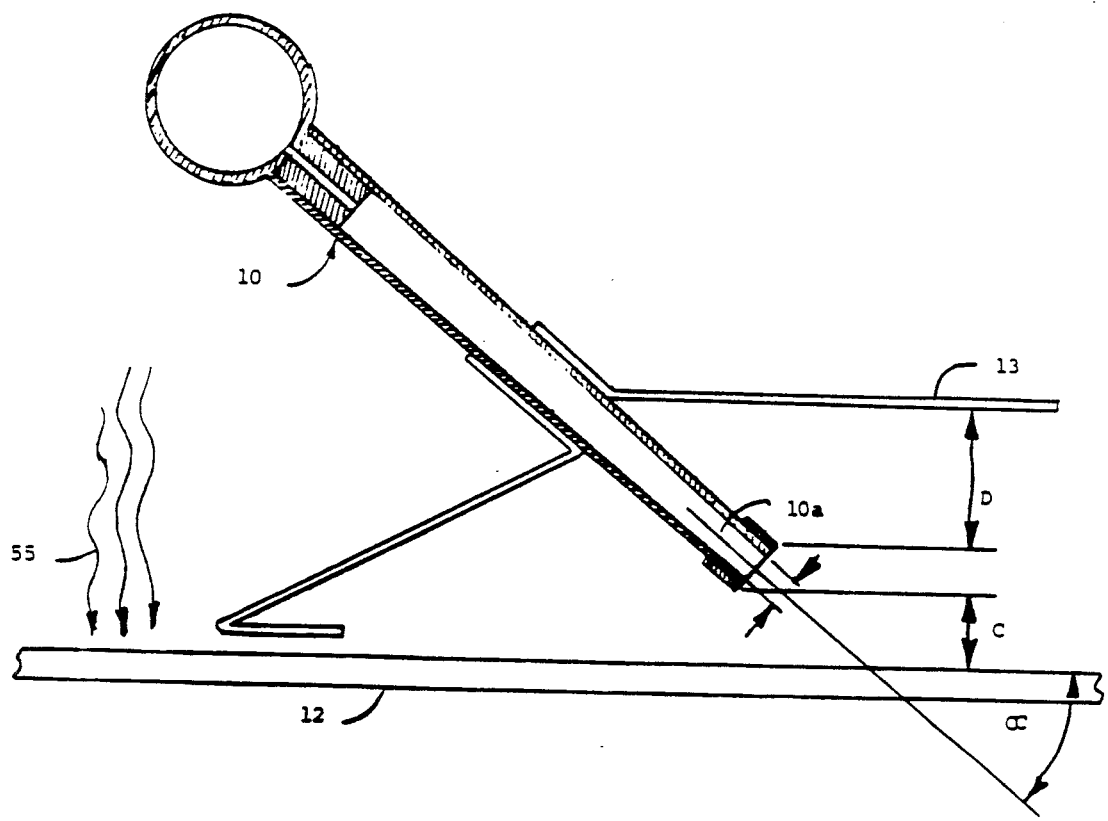
FIG. 5 is a cross-sectional view of a confined coating nozzle provided with a top plate parallel to the surface of the substrate above the uppermost point of the nozzle opening.

Suitable values of nozzle angles $\alpha$, jet velocity and clearance C for preventing intermixing of coating gas 15 with outside air 19 are presented graphically in FIG. 4 for the embodiment of a nozzle as illustrated in FIG. 3. Each point on the curves of FIG. 4 represents the condition of substantially no outside gas flowing into the coating zone, or of substantially no coating chemical and carrier gas escaping to the outside atmosphere. These gas movements were observed by using a small smoke plume 55, as shown in FIG. 5, originating just outside the coating zone and issuing perpendicular to the substrate 12. An example of such suitable values, where there is substantially no intermixing of coating chemical and carrier gas with the outside atmosphere, are a nozzle angle of 30°, a jet velocity of 10 meters per second (m/sec.), and a clearance of 12 millimeters (mm).

Figure 6:
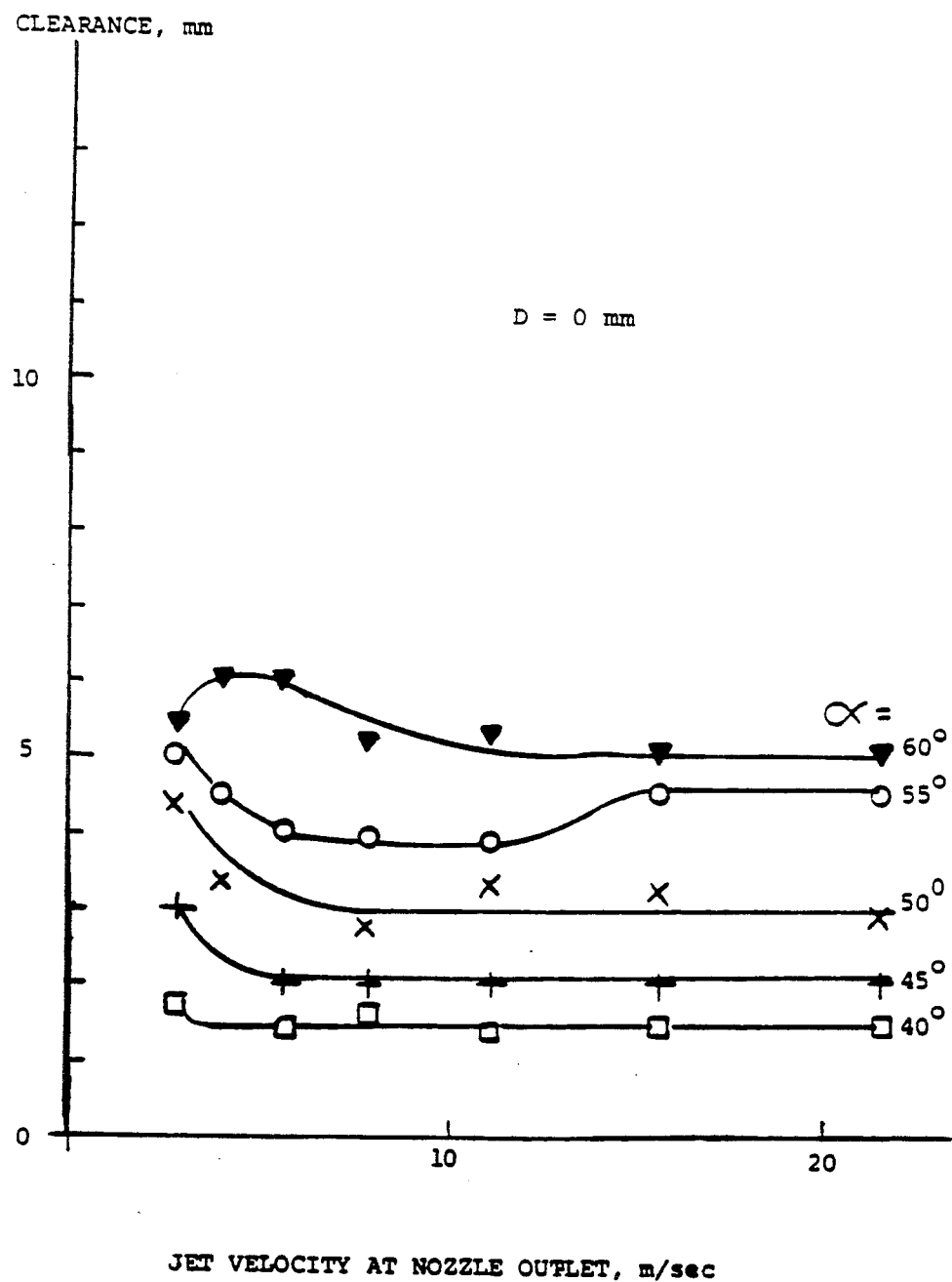
FIG. 6 is a graphic diagram similar to FIG. 4 for the nozzle apparatus of FIG. 5.
Figure 7:
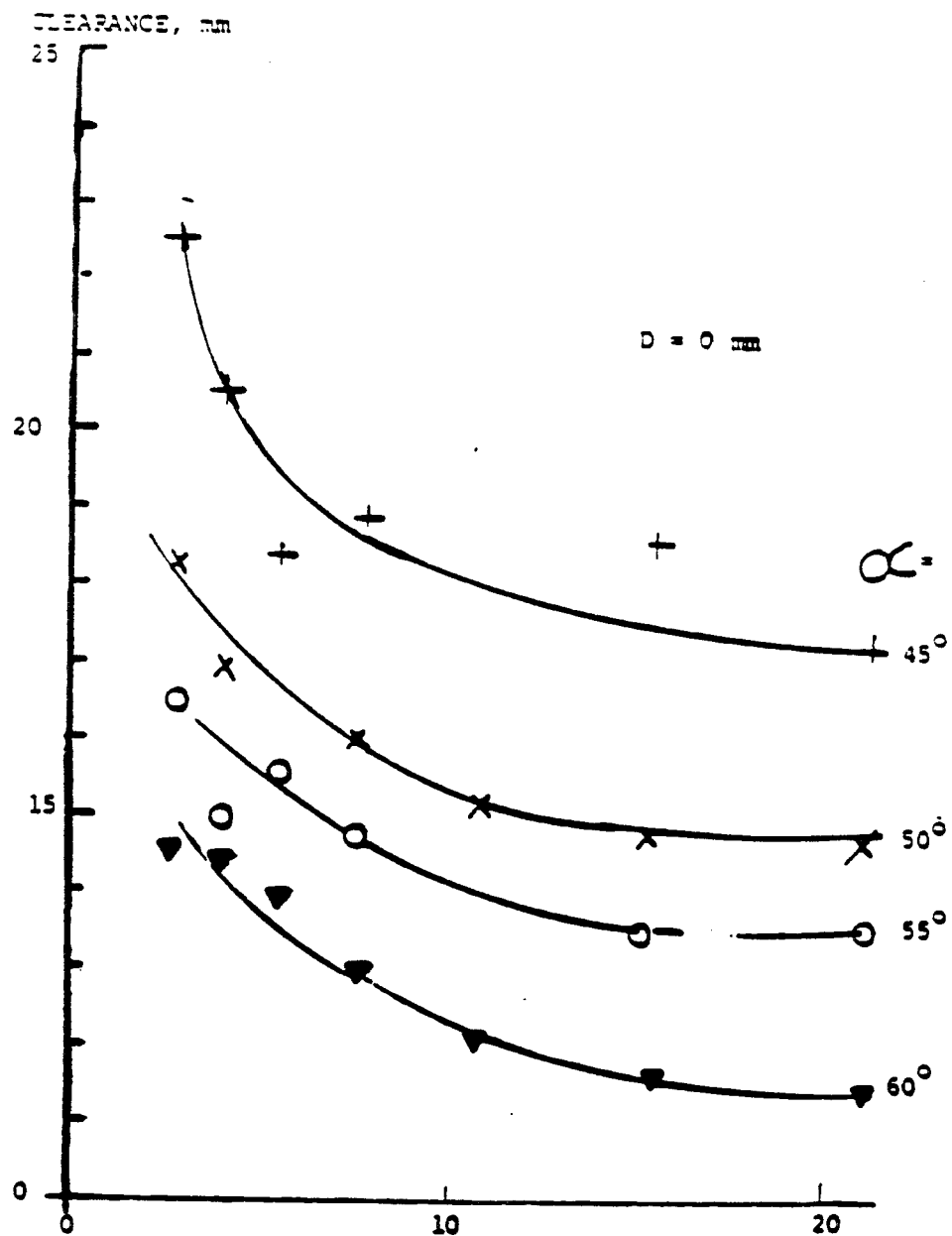
FIG. 7 is a graphic diagram similar to FIG. 6, showing a second condition for substantially zero air intermixing.

FIG. 5 shows a cross-sectional view of a confined nozzle, which is a nozzle equipped with a top plate 13 positioned at the exit side of nozzle 10, positioned parallel to the surface of the substrate 12 and separated by a distance D above the uppermost point 10a of the nozzle outlet. The presence of top plate 13 is a factor in determining suitable nozzle angles for the condition of zero intermixing of gases. Specifically, with the top plate 13 present as part of the nozzle apparatus, a relatively lower nozzle angle will provide the same desired condition of zero gas entrainment as a nozzle without such plate element. FIGS. 6 and 7, where the distance D equals zero mm, also demonstrate this relationship.

Figure 8:
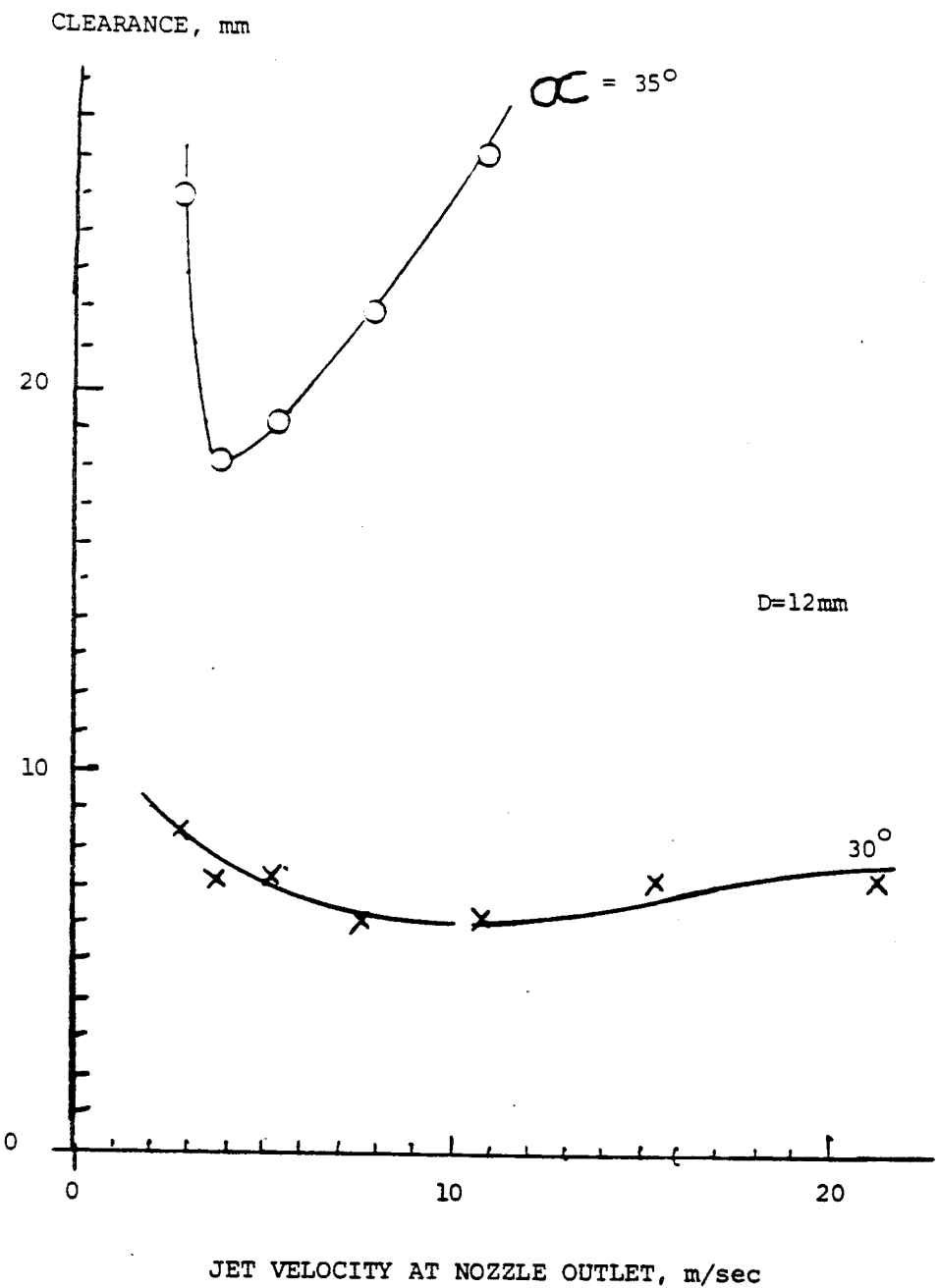
FIG. 8 is a graphic diagram similar to FIG. 6.

In addition, with distance D set at zero, and for such smaller nozzle angles, two clearance values exist for the condition of zero outside-air entrainment. The first clearance values, shown in FIG. 6, are in the range of 0 to 6 mm, while the second clearance values, shown in FIG. 8, are in the range of 10 to 25 mm. Thus, if the clearance distance C is increased from zero, there is a first outward flow of gas from the jet, which becomes zero at the first clearance value, followed by an inward flow of air to the jet, and then to a zero air flow at the second clearance value. However, second zero-entrainment values are not present for nozzle angles less than approximately 45°. Upon further decrease in the clearance distance C, the air flow becomes outward for nozzle angles above approximately 50°, and inward for nozzle angles between approximately 45° and 50°.

At a value of D of 12 mm, the nozzle jet of FIG. 5 behaves in a fashion similar to that of the free-nozzle, i.e., unconstrained, system of FIG. 3. This effect is demonstrated in FIG. 8. Accordingly, if the value of D is increased to about five times that of the nozzle slit width 14, the presence of top plate 13 has no appreciable effect on the selected nozzle angles $\alpha$.

Figure 9:
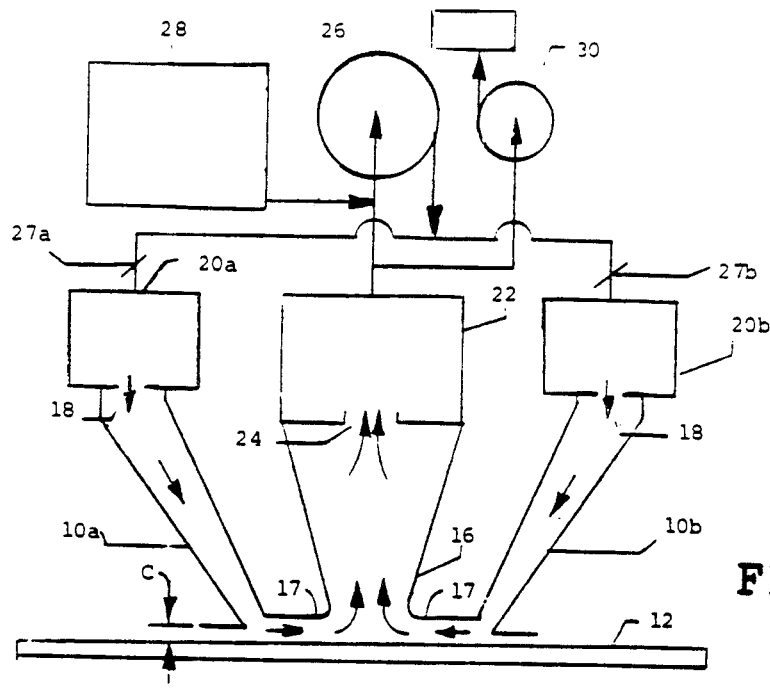
FIG. 9 is a schematic illustration of a coating applicator according to one embodiment of the present invention.

In FIG. 9, the applicator includes nozzles 10a and 10b for applying a vaporized coating chemical and carrier gas to substrate 12, which generally moves relative to those nozzles. The nozzles are arranged in opposing relation to and toward each other, each oriented at an angle of approximately 30° to 70° to substrate surface 12. Nozzles 10a and 10b are separated from substrate surface 12 by clearance C, which is preferably as small as possible. In particular, the nozzle angles, clearance C and jet velocities are selected, as discussed above, to correspond to a condition of substantially zero gas intermixing. With such an arrangement, dilution of coating gases with outside gas both inside and outside of the coating zone is avoided or minimized.

Figure 12:
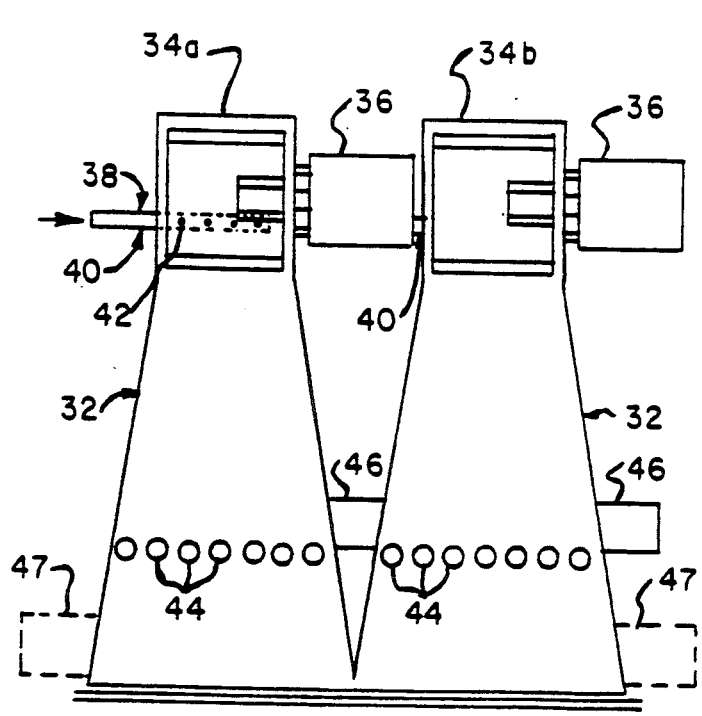
FIG. 12 is a drawing of the coating applicator of FIG. 11. viewed along line 12—12 thereof.
Figure 16:
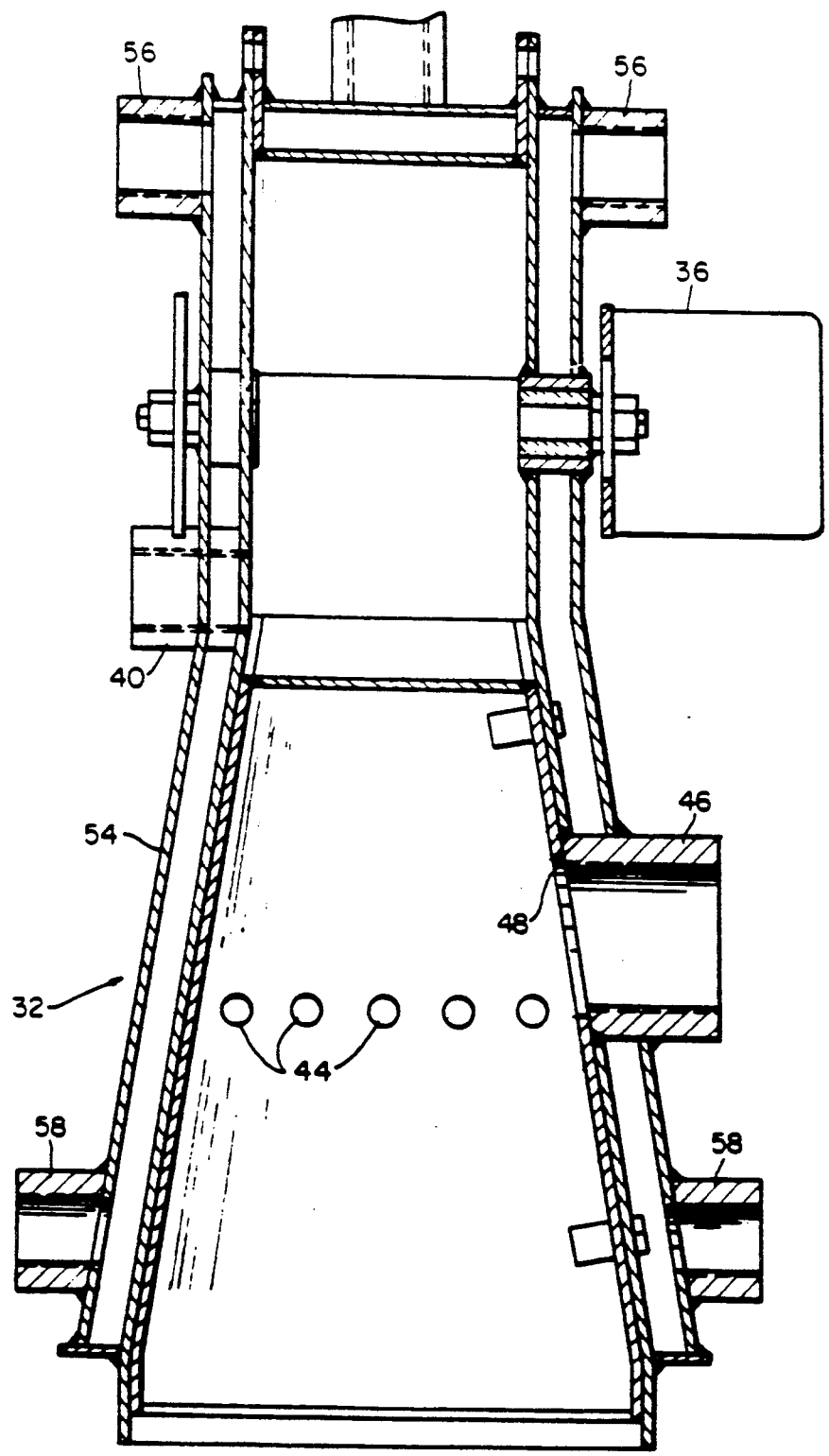
FIG. 16 is another cross-section of the coating applicator of FIG. 15, taken along lines 16—16 thereof.

Continuing with the description of FIG. 9, an internal recirculation duct 16 is provided between nozzles 10a and 10b for recirculating coating gases. Valves 27a and 27b in the recirculating lines are positioned upstream of nozzle headers 20a and 20b to allow the opposing jet velocities in the nozzles 10a and 10b to be balanced. Thereby, substantially no recirculating gas can escape to the outside atmosphere. In addition, exhaust holes 44 shown in FIGS. 12 and 16 are included to remove the stream of spent coating gases uniformly over the full width of the applicator.

Preferably, each nozzle 10a and 10b will have a length, in a direction perpendicular to the glass substrate travel, which is substantially equal to the width of the flat glass substrate to be coated. This width may extend up to several meters. In this regard, the circulating coating gas is divided substantially equally over the full length of the nozzles. For example, as shown in FIG. 9, a series of holes 18, equally spaced over the full length of the nozzle headers 20a and 20b, supply the vaporized coating chemical to nozzles 10a and 10b, respectively.

In like manner, recirculation duct 16 also extends for a length substantially equal to the width of the flat glass substrate to be coated. Accordingly, a recirculation header 22 is provided having holes 24 equally divided over its full length.

By having relatively low gas velocities in headers 20a, 20b and 22 in comparison with the high gas velocities in holes 18 and 24, those holes provide an equal distribution of gases. Alternatively, holes 18 and 24 may be replaced by slits or may even be eliminated, whereupon headers 20a, 20b and 24, which are provided with equally spaced branches, partly or fully assume that function.

Recirculating blower 26 introduces the vaporized coating chemical and carrier gas to nozzle headers 20a and 20b. In a preferred embodiment, both recirculating blower 26 and exhaust blower 30 are operative, whereby a part of the gases is recirculated and another part is exhausted to the atmosphere through a suitable pollution-control system, not forming a part of this invention, and well known to those skilled in the art. With the system of FIG. 9, although only two elongated nozzles 10a and 10b are shown, it is understood that a plurality of such nozzles can be used on each side. In this case, it is only necessary to incline the outer nozzles at a suitable angle towards each other; the inner nozzles can be set at other angles, including one which is perpendicular to the substrate, although it is preferable that the inner nozzles be suitably angled, too.

Figure 10:
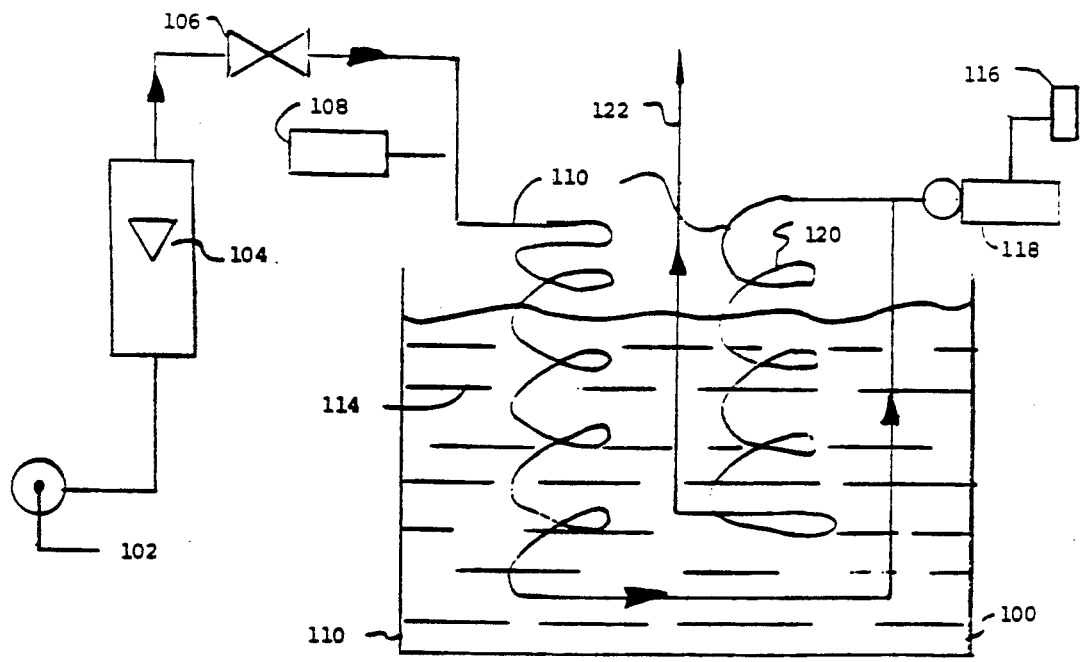
FIG. 10 is a schematic illustration showing the vaporized-chemical reactant-supply system in more detail.

There is shown in FIG. 10 a detailed illustration of a typical vaporization system 100 for supplying the vaporized coating chemical 28 in the coating applicator of the present invention. Accordingly, a source of dry compressed air 102 is metered into the vaporization system using a rotameter 104 equipped with a manual control valve 106. A suitable amount of water can be injected into the gas stream, by pump 108 if desired. The air-water stream then enters a humidification section 110 of the vaporizer, which consists of a downward-spiral coil 112 of process tubing situated in a circulating hot-oil bath 114 maintained at a suitable elevated temperature, e.g., at about 240° C.

The process tubing then returns to the top of the bath 114, at which point the liquid coating chemical 116 is introduced at a predetermined rate by means of syringe pump 118. A second downward coil 120, within the same circulating hot-oil bath 114, provides sufficient heat and mass transfer to effect vaporization of the coating chemical without decomposition. The desired vapor stream then exits the hot oil bath via an oil-traced or otherwise heated tube 122, and is led to the nozzle headers of the coating applicator, as for example, through the recirculation stream.

The coating-chemical reactants which are preferred for CVD onto glass in accordance with the present invention are pyrolyzable organometallic compounds. Organic compounds of metals of Group Ib through VIIb and of Group VIII of the periodic table may be employed; e.g., betadiketonates and acetylacetonates of metals such as cobalt, iron and chromium may be used.

Figure 11:
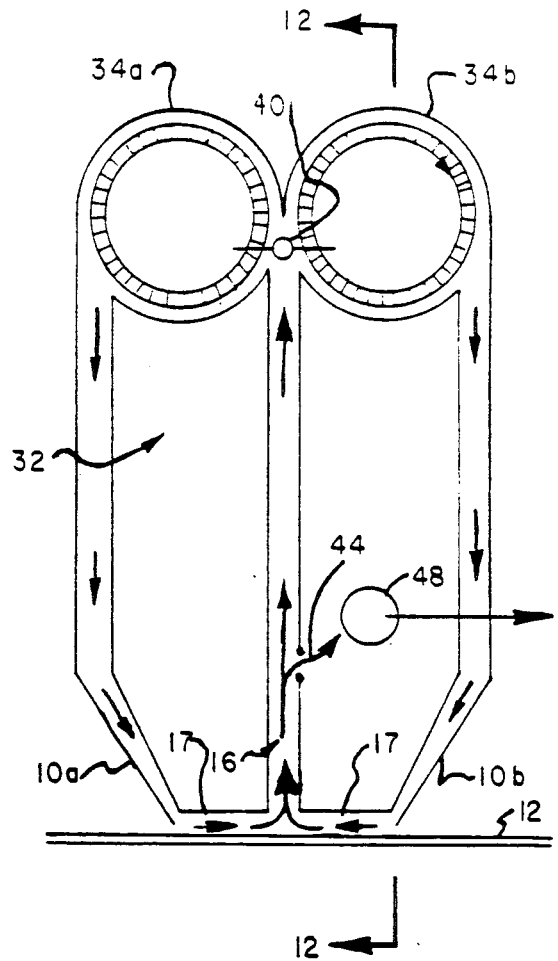
FIG. 11 is a view of a coating applicator consistent with FIG. 9, showing one embodiment of a recirculation-blower system.

Referring now to FIGS. 11 and 12, there is shown a modification of the system of FIG. 9; where like parts occur in FIGS. 11 and 12, a detailed description of such like parts is omitted herein for brevity. Specifically, a housing 32 is provided which fluidly interconnects nozzles 10a and 10b with exhaust duct 16. Recirculation is effected by providing impellers 34a and 34b which rotate inside housing 32 to recirculate air from exhaust duct 16 to nozzles 10a and 10b. Each impeller 34a and 34b is rotatably driven by a respective motor 36, although it is within the spirit and scope of this invention that they be jointly driven. As shown in FIG. 12, a plurality of such systems can be linked together to cover a glass substrate having a width larger than can practically be covered with one system.

As with the embodiment of FIG. 9, the impeller system of FIGS. 11 and 12 provides for a supply 38 of coating chemical in a carrier gas. This supply is provided to feed pipe 40, positioned within each housing 32 between and fluidly connected with impellers 34a and 34b. In this regard, each feed pipe 40 includes a plurality of small holes 42 divided over the length thereof in order to divide the coating chemical equally over the length of the coating chamber.

In addition, a series of exhaust holes 44 are provided in fluid communication with exhaust port 48 through one housing 32. Further, side exhaust headers 47, shown in dashed lines in FIG. 12, can be provided at the opposite sides of the applicator, i.e., at the edges of the substrate, for preventing escape of spent gases from opposite sides of the apparatus.

Figure 13:
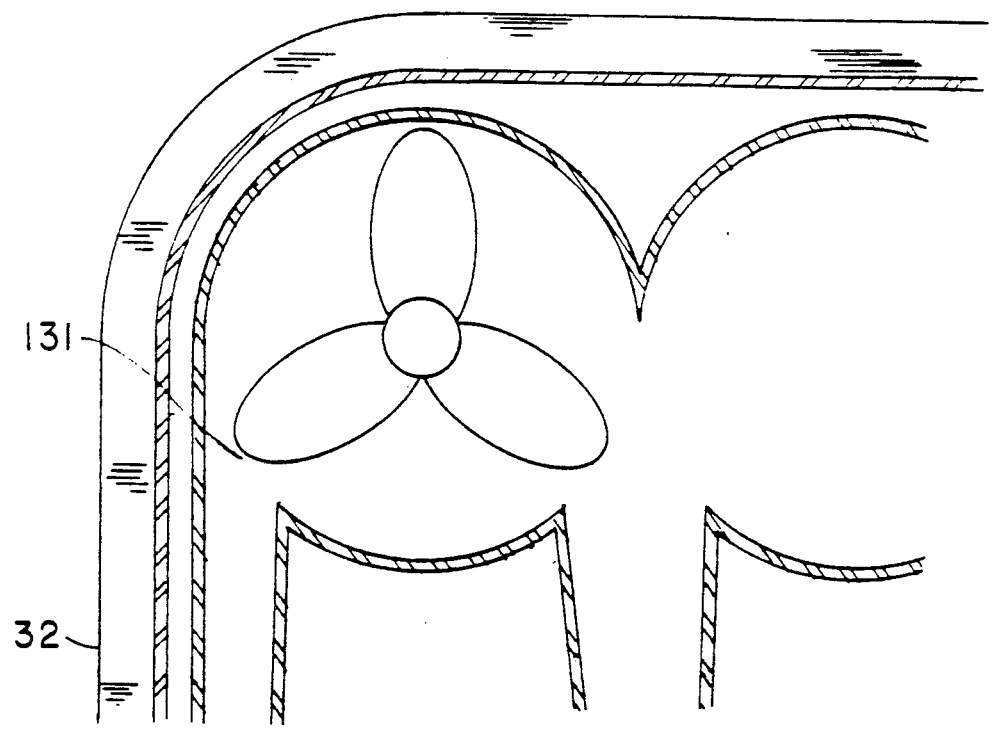
FIG. 13 illustrates an alternative blower.

Those skilled in the art will realize that the impellers 34 shown in FIGS. 11 and 12 can be of a form other than a paddle wheel or squirrel cage as illustrated. Accordingly, an alternative embodiment is shown in FIG. 13, where the impeller is a propeller-type fan blade 131.

Figure 14:
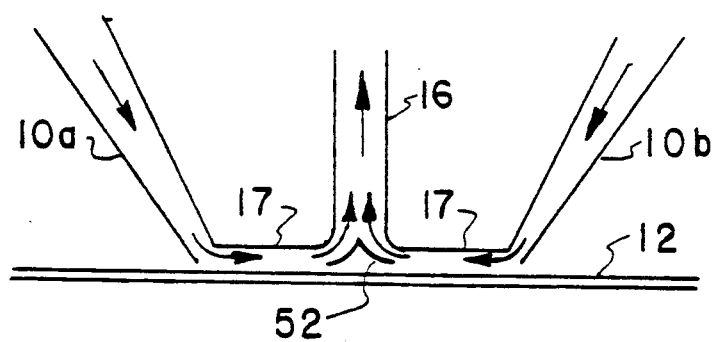
FIG. 14 shows a guide means in the coating zone of the apparatus of this invention.

In the systems of FIGS. 9, 11 and 12, it is important that the velocity of the coating gas 15 issuing from nozzles 10a and 10b be substantially the same. Otherwise, the higher gas velocity in nozzles 10a or 10b will allow gases to escape below the outer rim of the opposite nozzle. In order to minimize this, a guide element 52 extending the length of each housing 32 may be provided centrally below exhaust duct 16, as shown schematically in FIG. 14.

In order to minimize the reaction of vaporized coating chemical on the walls of nozzles 10a and 10b and duct 16, it is preferable to maintain such walls at a constant temperature. In the case of the CVD of, e.g., monobutyltin trichloride on glass, with or without a fluorine-containing dopant, a temperature of about 200° C. is conveniently maintained by, e.g., an oil jacket or other suitable means for cooling or heating of the circulating gases. For instance, oil jacket 54 is provided in surrounding relationship to the nozzle walls, including oil inlet 58 and oil outlet 56 on the sides of housing 32. Impellers 34a and 34b are omitted from FIGS. 15 and 16. Preferably, for larger systems, centrifugal blowers can be used, as shown in FIG. 9, but for small systems, the impellers shown here provide a uniform velocity when a slit width of about 90 mm is used for the outlets of nozzles 10a and 10b. Thus, there is substantially no intermixing of coating gases with outside air, and very little exhaust power is required to prevent circulating gases from escaping from the system.

Figure 17:
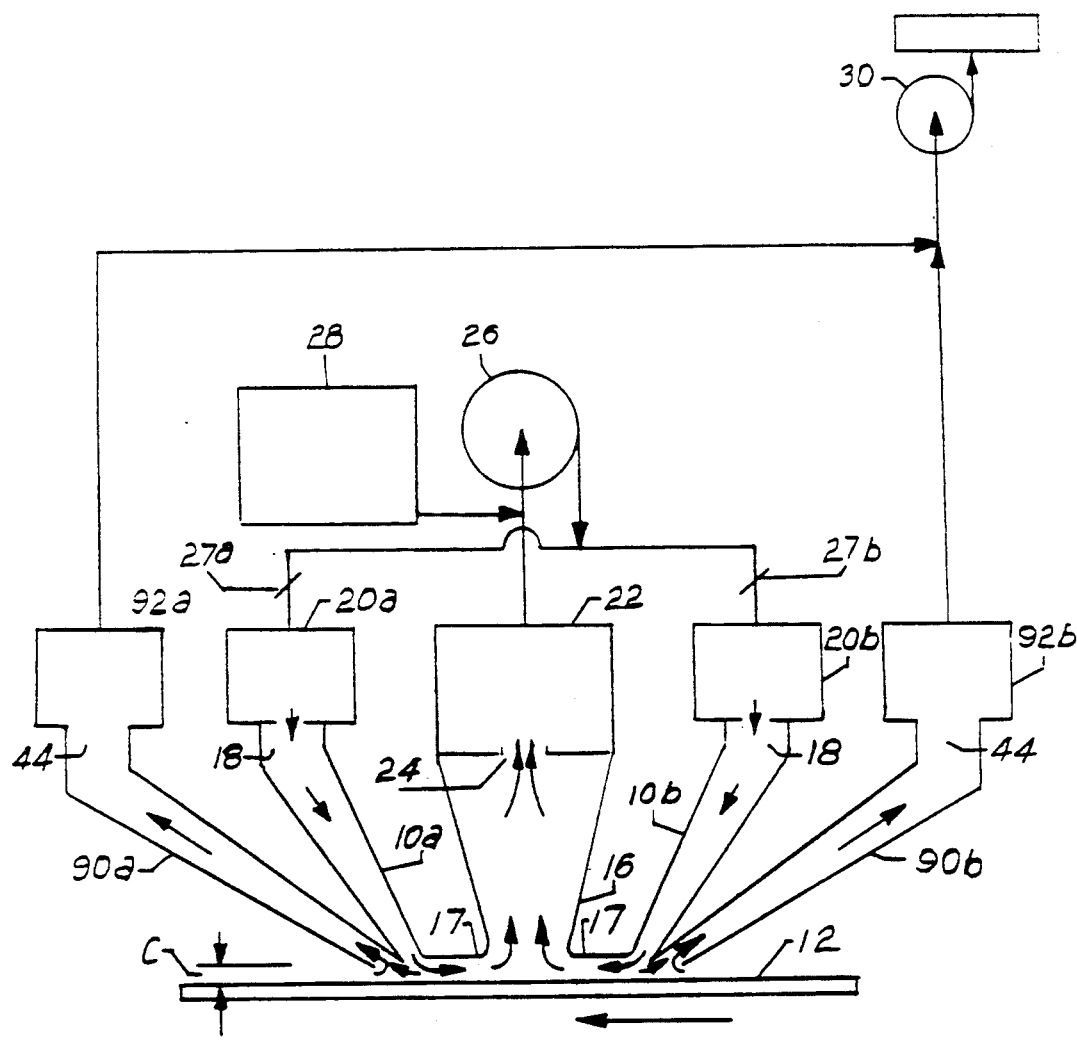
FIG. 17 is a schematic illustration of a coating applicator according to another embodiment of the invention in which the exhaust is drawn from points external to the nozzles and recirculation system.

FIG. 17 is a schematic view of a modification of the coating-applicator system of the invention. In this embodiment, the exhaust is drawn from points external to the nozzles and recirculation lines.

Figure 18:
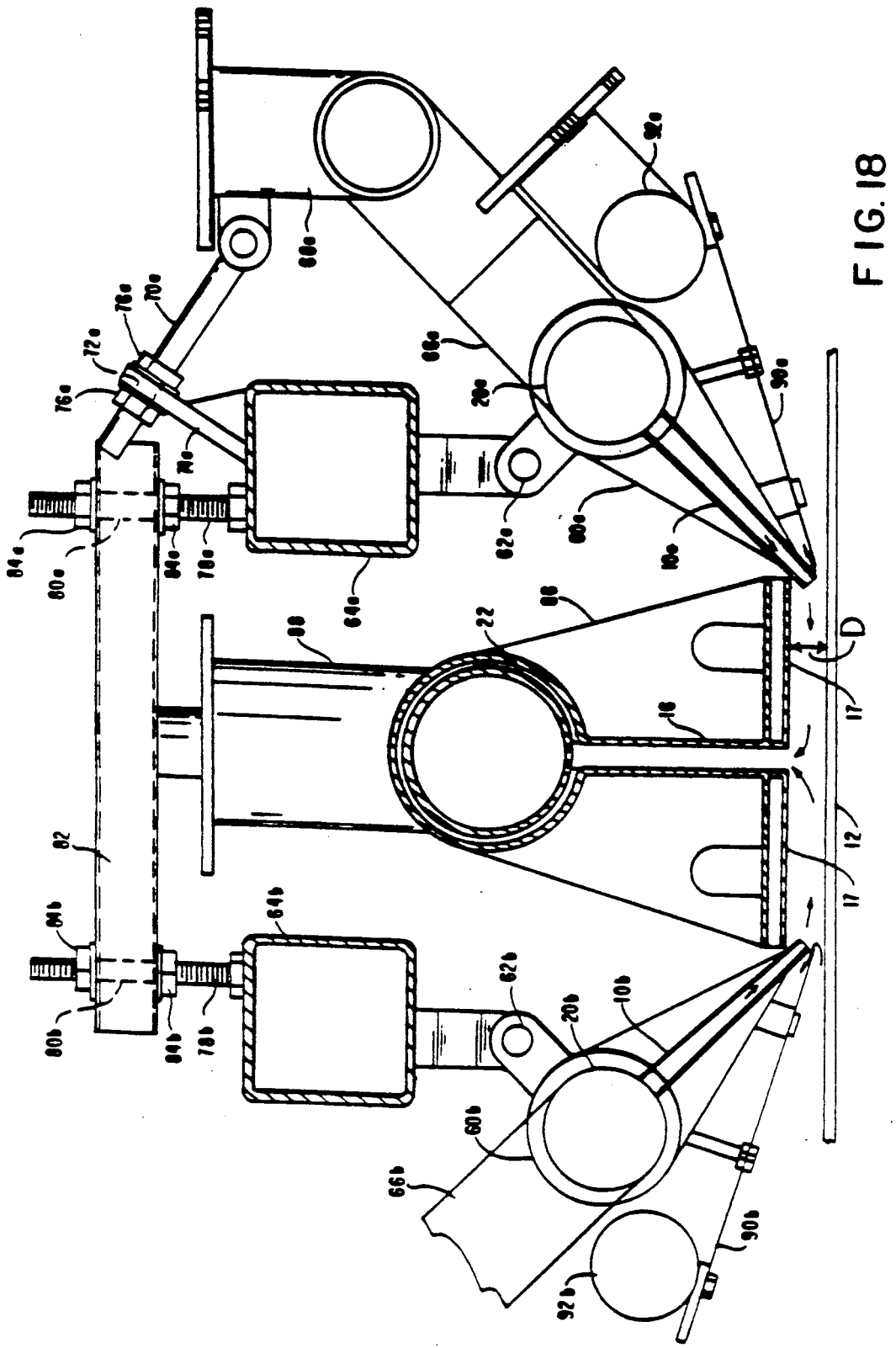
FIG. 18 is a cross-sectional drawing of a coating applicator consistent with FIG. 17, taken along the direction of travel of the flat glass substrate.

FIG. 18 is a cross-sectional drawing of the system of FIG. 17, taken along the direction of glass travel. For the sake of brevity, a detailed description of the elements in this modified system which are like those in the embodiment of FIG. 9 will be omitted. As shown in FIG. 18, nozzle 10a and nozzle header 20a are secured within housing 60a, the upper end of which is pivotally secured by pivot pin 62a to frame 64a. In like manner, nozzle 10b and nozzle header 20b are secured within a housing 60b, the upper end of which is pivotally secured by pivot pin 62b to frame 64b.

In addition, nozzle header 20a is provided with an extension 66a in fluid communication therewith and extending axially away from nozzle 10a. A supply pipe 68a is secured in fluid communication with extension 66a. Supply pipe 68a, in turn, is pivotally secured to a screw-threaded rod 70a, positioned through hole 72a, which allows adjustment of the angle between the nozzle 10a and the surface of the substrate. In like manner, nozzle header 20b can be adjusted.

The screw-threaded rods 78a and 78b are secured to frames 64a and 64b, and extend through slotted holes 80a and 80b in main frame 82 of the apparatus. Rods 78a and 78b can be adjusted in height independently within hole 80a and 80b to change the distance of clearance D between the respective outlet and top plate 17. The angle between the substrate and the nozzle is chosen at approximately 55°, at clearance values corresponding to the first zero-entrainment point.

As shown, recirculation header 22, top plate 17 and duct 16 are carried by housing 86, which has an extension 88 in fluid communication therewith, the latter being secured to main frame 82 for vertical movement with nozzles 10a and 10b. Those skilled in the art will realize that main frame 82 can be secured to means, not shown, to permit adjustment of the clearance between nozzles 10 and substrate 12.

In accordance with this embodiment of the invention, external exhaust nozzles 90a and 90b are mounted with coating nozzles 10a and 10b below the exhaust nozzles, so that the inlets of exhausts 90a and 90b are positioned with the same clearance above substrate 12 as, and external to, the outlets of coating nozzles 10a and 10b. External exhaust headers 92a and 92b are fluidly connected to an exhaust blower (not shown) which removes the spent coating material to the atmosphere through suitable pollution-control apparatus, not shown, but well known to those skilled in the art. This apparatus includes, without limitation, distillation columns, stack scrubbers and the like. Recirculation header 22 is fluidly connected to the recirculation blower (not shown) and may be used also to exhaust part of the recirculating gases.

Figure 19:
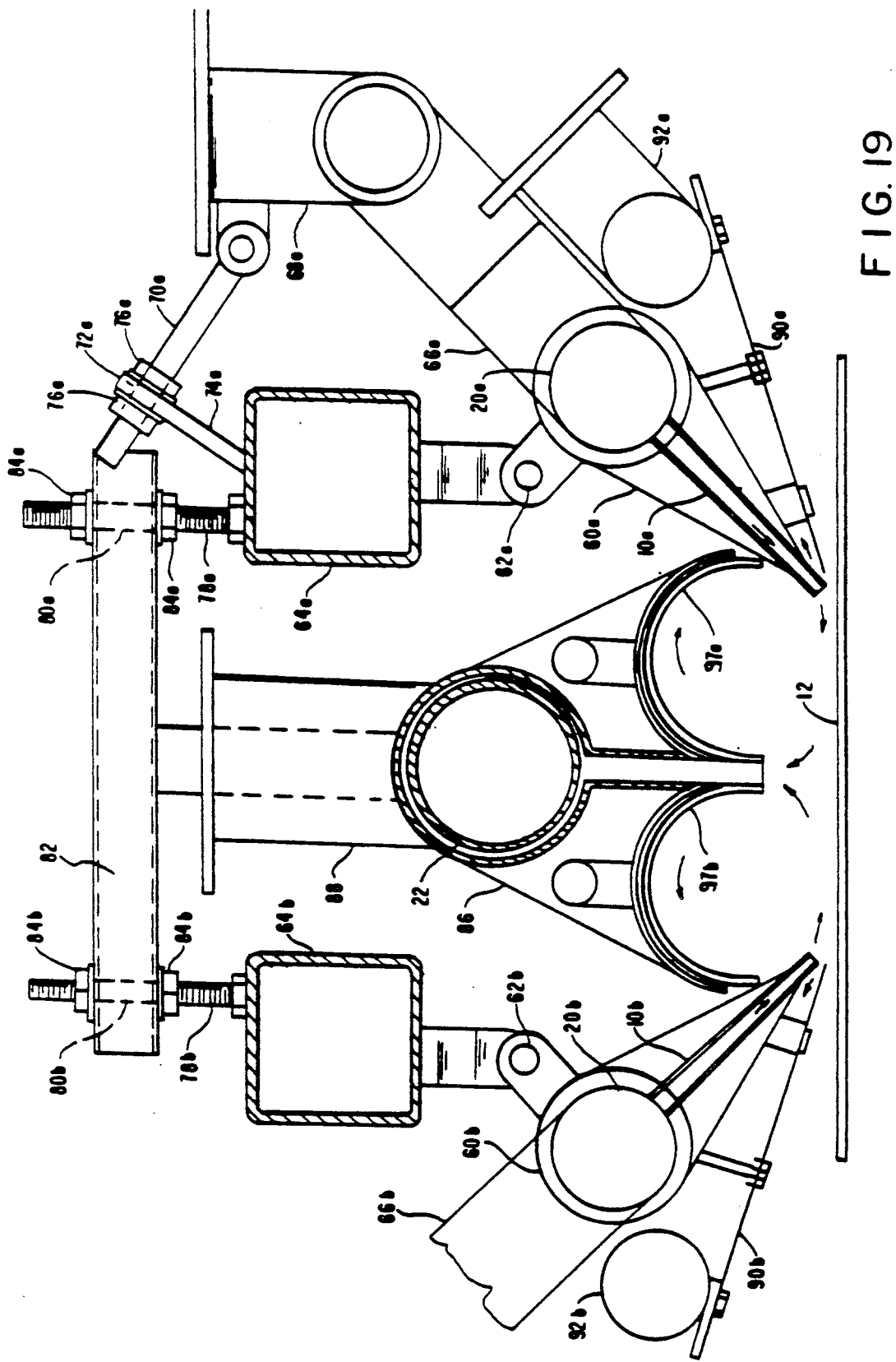
FIG. 19 is a cross-sectional view of another embodiment of the coating applicator of FIG. 18.

In FIG. 19, there is shown a modification of the system of FIGS. 17 and 18. Top plates 17 of FIG. 17 are replaced by hollow, cylindrical plates 97a and 97b. With this arrangement, gases will circulate within the cylindrical chamber defined by plates 97, as indicated by arrows 140 in FIG. 19. As a result of such recirculation, the velocity of the coating gas is maintained high and constant over the full length of the applicator. Because the coating jets behave like jets without a top plate in this embodiment, the optimum angle of nozzles 10a and 10b preferably is within the range of about 50° to 70°, as opposed to a preferred angle in the range of about 30° to 70° for the embodiment of FIG. 17.

In the embodiments of FIGS. 17, 18 and 19, external exhaust inlets 90a and 90b may be used to admit a barrier gas, which is exhausted from recirculating pipe 88. Alternatively, although not shown, a barrier gas can be admitted between coating nozzles 10a and 10b and exhaust inlets 90a and 90b.

Films prepared according to the preferred embodiments of the invention have infrared reflectivities greater than 70% at the conventional 10-micron wavelength characteristic of thermal radiation at room temperature, a visible transmittance of 80% or greater, a sheet resistance of less than 40 ohm/sq., and conductivities greater than 1250 (ohm-centimeters [cm])$^{-1}$ for films from about 160 to about 2500 Å thick. These films show the uniform iridescence in reflected light which indicates a uniform film, and are substantially haze-free. Deposition is carried out at a rate of about 1000 Å/sec. or greater; thereby the desired film thickness of 2000 Å is obtained within two seconds or less.

In general, to increase the deposition rate, the substrate is maintained at a temperature as high as reasonably possible. For tin-oxide films, this deposition temperature is from about 550 to about 750° C., and preferably from about 600° to about 700° C. The maximum jet velocity is determined by practical considerations, such as its effect on cooling of the substrate, and the desired balance of the coating nozzles. Similarly, the maximum coating concentration in the system is limited by the vapor pressures and decomposition temperatures of the coating chemicals used, and by the amount of other reactants such as water and oxygen needed for reaction with the coating chemical.

As described, prevention of intermixing of coating gases with the outside atmosphere in this invention is important for several reasons. If the outside air is allowed to enter the coating zone, there is an immediate dilution of the concentration of the coating chemical within the coating zone, which upsets the reaction-rate-controlled conditions. Similarly, leakage of coating chemical into the outside atmosphere provides coating chemical at a very low concentration and at a low velocity at substrate sites outside of the coating zone, and this results in deposition of films under diffusion-rate control whereby the films are unacceptably hazy.

The slit width of the nozzles in this invention should be large enough to prevent clogging but small enough to maintain the desired jet velocities. A suitable width is about 5 mm.

The coating applicator of the present invention may be used to apply coating films on the bottom or top surfaces of a flat glass substrate, either from above or below the substrate, generally and preferably while it is moving. The apparatus can be used also for off-line coating, using reheated glass.

Figure 15:
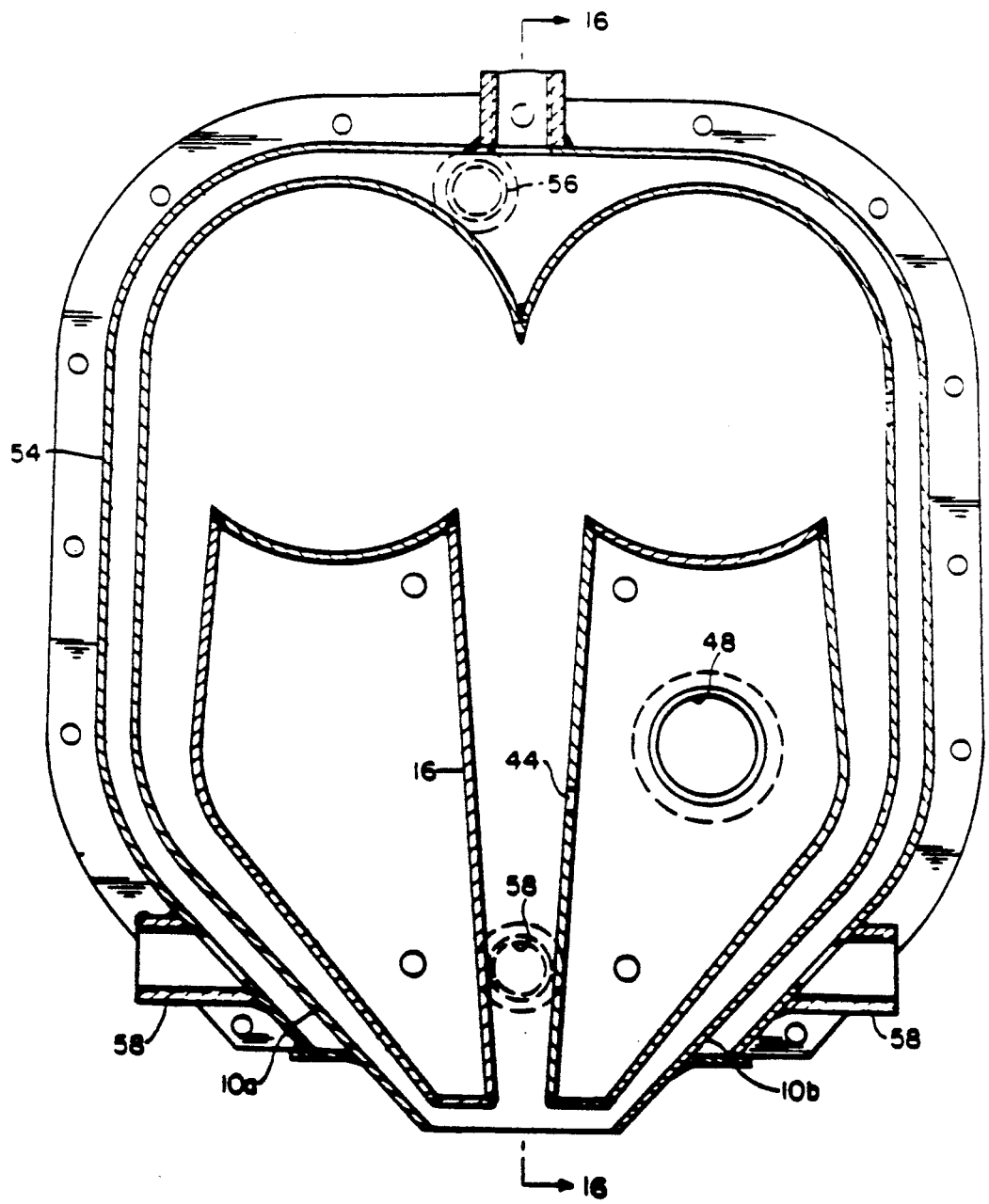
FIG. 15 shows an embodiment of the coating applicator of FIG. 9 in cross-section.

To illustrate the utility of the apparatus of this invention, a balanced coating applicator according to FIGS. 15 and 16 is equipped with the external exhaust of FIG. 18. The applicator has a coating zone of 44 mm. in length parallel to the direction of glass travel, and is 90 mm. in width. The two opposing nozzles of the applicator are directed towards each other at angles of 45° to the substrate, and the slit width is 3.5 mm. The external exhausts have slots which are 4 mm. in width, and are positioned immediately external to and adjacent the coating nozzles. The substrate is 1.5 mm.-thick soda-lime float glass having its float side resting on a heating table maintained at 650°. During coating, the substrate is moved past the applicator nozzles at a constant speed of 3.14 cm./sec. The clearance between substrate and nozzle is maintained at approximately 2 mm.

In the vaporizer apparatus of FIG. 10, 9.7 milliliters ml/hr. per hour) of distilled water is injected into a 2.09 standard liter per minute air system. This stream enters the first coil of the vaporizer, which is immersed in an oil bath maintained at 240° C., where the water is vaporized and the process stream is preheated. Then 106 ml/hr of a liquid coating-chemical composition, as described in U.S. Pat. No. 4,601,917, is injected into the preheated air-water stream and vaporized in the second coil of the vaporizer. This vapor stream then is admitted into the recirculation duct of the coater.

The recirculation rate of the coater is set such that a jet velocity of 5 m/sec. is measured at the exit of each of the nozzles. The external exhaust rate is set to approximately $\frac{2}{3}$ of the volumetric recirculating rate. The measured temperature of the circulating gas stream is approximately 180° C.

After depositing for a period of 1.4 sec., a doped tin oxide film is formed on the surface of the glass. This film has a thickness of 1850 Å, corresponding to a deposition rate of 1320 Å/sec. The electrical resistance of the film is 37 ohms/square, and it is observed to be uniform, transparent and substantially haze-free.

What is claimed is:

1. A process for coating a substrate by chemical-vapor deposition comprising the steps of maintaining the substrate at a deposition temperature sufficient to cause a vaporized coating-chemical reactant in a carrier gas to react and deposit a film on the surface, vaporizing the coating-chemical reactant, applying the vaporized coating-chemical reactant in the carrier gas through at least a pair of opposed coating nozzle means to the surface at such a concentration and gas velocity that coating is carried out under substantially reaction-rate-controlled conditions, each of the nozzle means being positioned adjacent the surface of the substrate with a clearance therebetween which is open to the outside atmosphere and at a selected angle with respect to the surface such that there is substantially no intermixing of chemical vapors with the outside atmosphere, depositing the film on the substrate surface substantially without intermixing of the coating chemical with the outside atmosphere, and removing exhaust material.

2. A process according to claim 1 wherein the opposed streams have substantially the same chemical concentration therein, and are applied at substantially the same velocity to the surface.

3. A process according to claim 1 wherein the process provides a metal-containing film on the substrate.

4. A process according to claim 1 wherein the process provides a metal oxide film on the substrate.

5. A process according to claim 1 wherein the process provides a tin oxide film on the substrate.

6. A process according to claim 1 wherein the coating chemical includes a dopant precursor, and provides a film with a low-resistivity coating.

7. A process according to claim 1 wherein the carrier gas is air.

8. A process according to claim 7 wherein the coating chemical includes water.

9. A process according to claim 1 wherein the chemical reactant is an organotin compound.

10. A process according to claim 1 wherein the chemical reactant is monobutyltin trichloride.

11. A process according to claim 1 further comprising moving the substrate while applying the coating on its surface.

12. A process according to claim 11 wherein the substrate is flat glass.

13. A process according to claim 1 wherein deposition of the film is carried out at a rate of at least 1000 Å/sec.

14. A process according to claim 1 wherein the deposition temperature is at least 500° C.

* * * * *